United States Patent
Tanaka et al.

(10) Patent No.: US 7,910,432 B2
(45) Date of Patent: Mar. 22, 2011

(54) NON-VOLATILE SEMICONDUCTOR STORAGE DEVICE AND METHOD OF MANUFACTURING THE SAME

(75) Inventors: Hiroyasu Tanaka, Tokyo (JP); Masaru Kidoh, Komae (JP); Ryota Katsumata, Yokohama (JP); Masaru Kito, Yokohama (JP); Yoshiaki Fukuzumi, Yokohama (JP); Hideaki Aochi, Kawasaki (JP); Yasuyuki Matsuoka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 105 days.

(21) Appl. No.: 12/393,509

(22) Filed: Feb. 26, 2009

(65) Prior Publication Data

US 2009/0230462 A1   Sep. 17, 2009

(30) Foreign Application Priority Data

Mar. 17, 2008   (JP) ................ P2008-068426

(51) Int. Cl.
*H01L 21/336* (2006.01)
(52) U.S. Cl. ........ 438/257; 438/261; 438/264; 257/324; 257/326; 257/E29.309; 257/E21.423; 257/E21.679
(58) Field of Classification Search .................. None
See application file for complete search history.

(56) References Cited

U.S. PATENT DOCUMENTS

| 6,727,544 | B2 | 4/2004 | Endoh et al. |
| 6,870,215 | B2 | 3/2005 | Endoh et al. |
| 2007/0252201 | A1* | 11/2007 | Kito et al. ............... 257/331 |
| 2008/0149913 | A1 | 6/2008 | Tanaka et al. |

* cited by examiner

*Primary Examiner* — Julio J Maldonado
*Assistant Examiner* — Shaka Scarlett
(74) *Attorney, Agent, or Firm* — Oblon, Spivak, McClelland, Maier & Neustadt, L.L.P.

(57) ABSTRACT

Each of the memory strings includes: a first columnar semiconductor layer extending in a vertical direction to a substrate; a plurality of first conductive layers formed to sandwich an insulation layer with a charge trap layer and expand in a two-dimensional manner; a second columnar semiconductor layer formed in contact with the top surface of the first columnar semiconductor layer and extending in a vertical direction to the substrate; and a plurality of second conductive layers formed to sandwich an insulation layer with the second columnar semiconductor layer and formed in a stripe pattern extending in a first direction orthogonal to the vertical direction. Respective ends of the plurality of first conductive layers in the first direction are formed in a stepwise manner in relation to each other, entirety of the plurality of the second conductive layers are formed in an area immediately above the top layer of the first conductive layers, and the plurality of first conductive layers and the plurality of second conductive layers are covered with a protection insulation layer that is formed continuously with the plurality of first conductive layers and the second conductive layers.

20 Claims, 13 Drawing Sheets

Cross-Sectional View in Column Direction

Cross-Sectional View in Row Direction

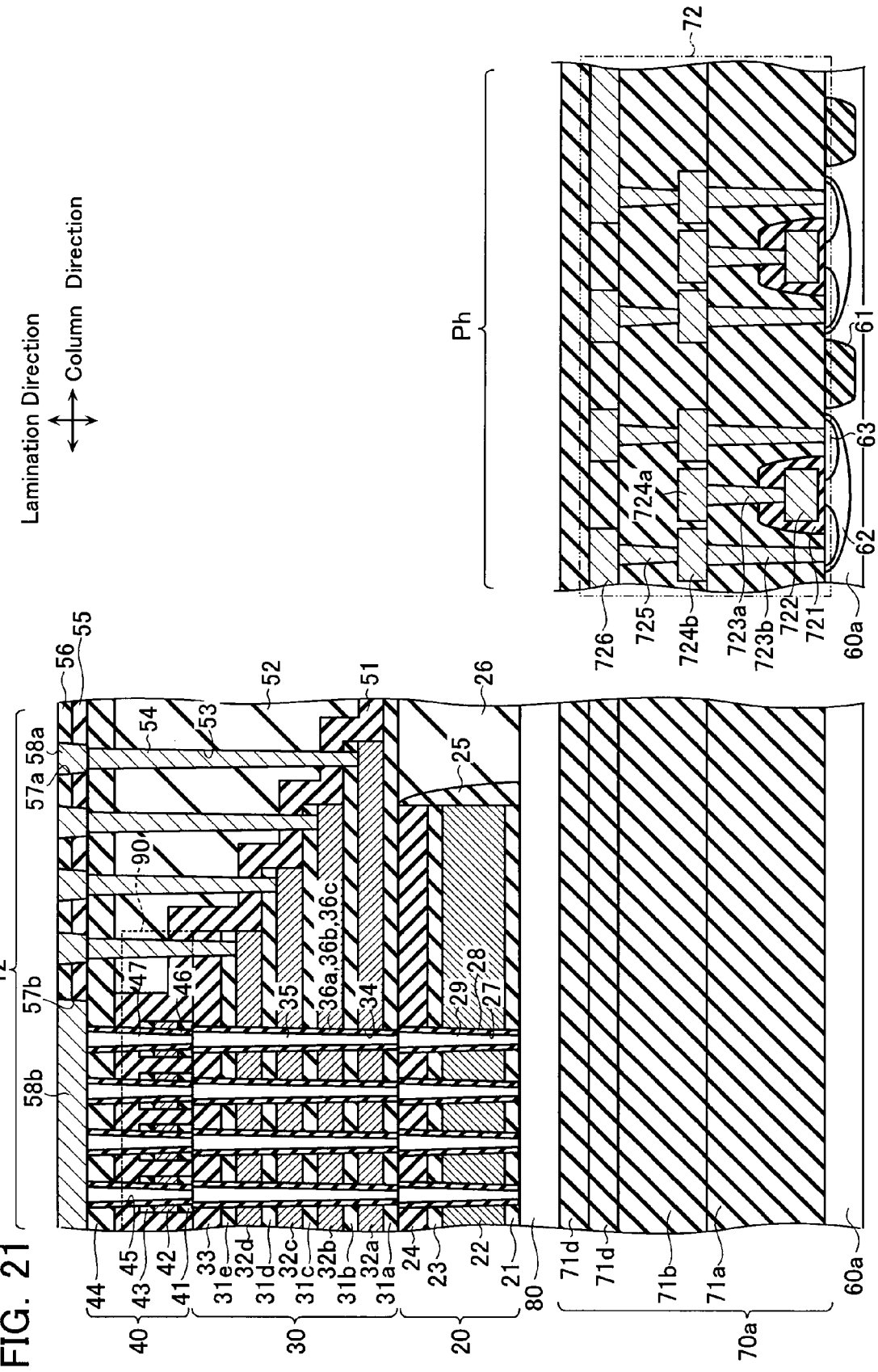

NON-VOLATILE SEMICONDUCTOR STORAGE DEVICE AND METHOD OF MANUFACTURING THE SAME

CROSS-REFERENCE TO RELATED APPLICATIONS

This application is based upon and claims the benefit of priority from the prior Japanese Patent Application No. 2008-68426, filed on Mar. 17, 2008, the entire contents of which are incorporated herein by reference.

BACKGROUND OF THE INVENTION

1. Field of the Invention

The present invention relates to an electrically rewritable non-volatile semiconductor storage device and a method of manufacturing the same.

2. Description of the Related Art

Conventionally, LSIs are formed by integration of devices in a two-dimensional plane on the silicon substrate. Although the dimension for each device must be reduced (refinement) to increase memory storage capacity, recent years are facing challenges in such refinement from the viewpoint of cost and technology. Such refinement requires further improvements in photolithography technology. However, in currently available ArF immersion lithography technology, for example, the resolution limit has been reached around the 40 nm design rule and so EUV exposure devices have to be introduced for further refinement. However, the EUV exposure devices are expensive and infeasible in view of the costs. In addition, if such refinement is accomplished, it is assumed that physical improvement limit, such as in breakdown voltage between devices, would be reached unless driving voltage can be scaled. Thus, it is likely that difficulties would be encountered in device operation itself.

Therefore, a large number of semiconductor storage devices have been proposed recently where memory cells are arranged in a three-dimensional manner to achieve improved integration of memory devices (see, Patent Document 1: Japanese Patent Laid-Open No. 2007-266143; Patent Document 2: U.S. Pat. No. 5,599,724; and Patent Document 3: U.S. Pat. No. 5,707,885).

One of the conventional semiconductor storage devices where memory cells are arranged in a three-dimensional manner uses transistors with a cylinder-type structure (see, Patent Documents 1-3). Those semiconductor storage devices using transistors with a SGT cylinder-type structure are provided with multiple conductive layers corresponding to gate electrodes and pillar-like columnar semiconductors. Each of the columnar semiconductors serves as a channel (body) part of each of the transistors. Charge accumulation layers are provided around the columnar semiconductors for accumulating charges. Such a configuration including conductive layers, columnar semiconductors, and charge trap layers are referred to as a "memory string".

In the manufacturing process of the memory strings, after laminating multiple conductive layers and insulation layers, those steps are performed to flatten the surface by Chemical Mechanical Polishing (CMP). Such process, however, requires a large number of manufacturing steps and thus the cost of manufacturing the semiconductor storage devices would not be inexpensive.

SUMMARY OF THE INVENTION

One aspect of the present invention provides a non-volatile semiconductor storage device comprising a plurality of memory strings with a plurality of electrically rewritable memory cells connected in series, each of the memory strings comprising: a first columnar semiconductor layer extending in a vertical direction to a substrate; a charge trap layer formed to sandwich an insulation layer with the first columnar semiconductor layer and accumulating charges; a plurality of first conductive layers formed to sandwich an insulation layer with the charge trap layer and expand in a two-dimensional manner; a second columnar semiconductor layer formed in contact with the top surface of the first columnar semiconductor layer and extending in a vertical direction to the substrate; and a plurality of second conductive layers formed to sandwich an insulation layer with the second columnar semiconductor layer and formed in a stripe pattern extending in a first direction orthogonal to the vertical direction, respective ends of the plurality of first conductive layers in the first direction being formed in a stepwise manner in relation to each other, entirety of the plurality of the second conductive layers being formed in an area immediately above the top layer of the first conductive layers, and the plurality of first conductive layers and the plurality of second conductive layers being covered with a protection insulation layer that is formed continuously with the plurality of first conductive layers and the second conductive layers.

In addition, another aspect of the present invention provides a method of manufacturing a non-volatile semiconductor storage device having a plurality of memory strings with a plurality of electrically rewritable memory cells connected in series, the method comprising: alternately laminating a plurality of first interlayer insulation layers and a plurality of first conductive layers; forming a first hole so as to penetrate the first interlayer insulation layers and the first conductive layers; forming a first columnar semiconductor layer in the first hole via a charge trap layer; alternately laminating second interlayer insulation layers and second conductive layers on the first interlayer insulation layers; forming the second interlayer insulation layers and the second conductive layers in a stripe pattern extending in a first direction orthogonal to a lamination direction; forming respective ends of the first interlayer insulation layers and respective ends of the first conductive layers in a stepwise manner in relation to each other; and covering the first interlayer insulation layers, the first conductive layers, the second interlayer insulation layers, and the second conductive layers with a protection insulation layer, in forming the respective ends in a stepwise manner, the second interlayer insulation layers and the second conductive layers are formed in such a way that the entire second interlayer insulation layers and the entire second conductive layers are formed in an area immediately above the top layer of the first conductive layers.

BRIEF DESCRIPTION OF THE DRAWINGS

FIG. 21 illustrates a cross-sectional structure in the column direction of a non-volatile semiconductor storage device according to a third embodiment.

DETAILED DESCRIPTION OF THE EMBODIMENTS

Embodiments of a non-volatile semiconductor storage device according to the present invention will now be described below with reference to the accompanying drawings.

First Embodiment

Figure 1:
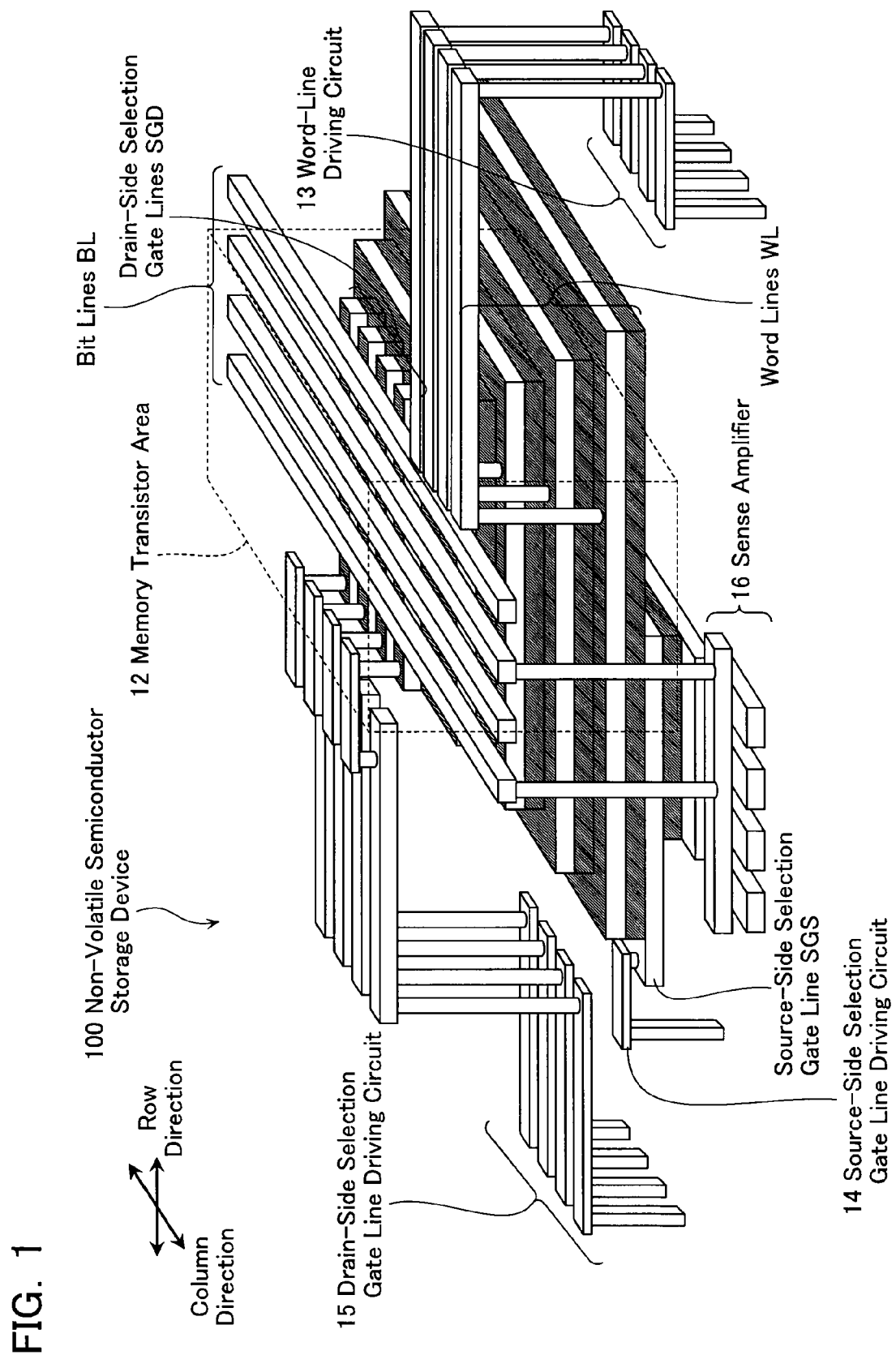
FIG. 1 is a schematic diagram illustrating a configuration of a non-volatile semiconductor storage device according to a first embodiment of the present invention.

Configuration of Non-Volatile Semiconductor Storage Device 100 in First Embodiment FIG. 1 schematically illustrates a non-volatile semiconductor storage device 100 according to a first embodiment of the present invention. As illustrated in FIG. 1, the non-volatile semiconductor storage device 100 according to the first embodiment mainly comprises: a memory transistor area 12; a word-line driving circuit 13; a source-side selection gate line (SGS) driving circuit 14; a drain-side selection gate line (SGD) driving circuit 15; and a sense amplifier 16. The memory transistor area 12 has memory transistors for storing data. The word-line driving circuit 13 controls voltage applied to word lines WL. The source-side selection gate line (SGS) driving circuit 14 controls voltage applied to the source-side selection gate line SGS. The drain-side selection gate line (SGD) driving circuit 15 controls voltage applied to drain-side selection gate lines SGD. The sense amplifier 16 amplifies a potential read from a memory transistor. In addition to this, the non-volatile semiconductor storage device 100 according to the first embodiment comprises a bit-line driving circuit for controlling voltage applied to bit lines BL and a source-line driving circuit for controlling voltage applied to source lines SL (not illustrated).

In addition, as illustrated in FIG. 1, in the non-volatile semiconductor storage device 100 according to the first embodiment, the memory transistors that configure the memory transistor area 12 are formed by lamination of a plurality of conductive layers. In addition, as illustrated in FIG. 1, a word line WL of each layer expands in a two-dimensional manner in a certain area. The word line WL of each layer has a planar structure of the same layer, respectively, providing a planar plate-like structure.

Figure 2:
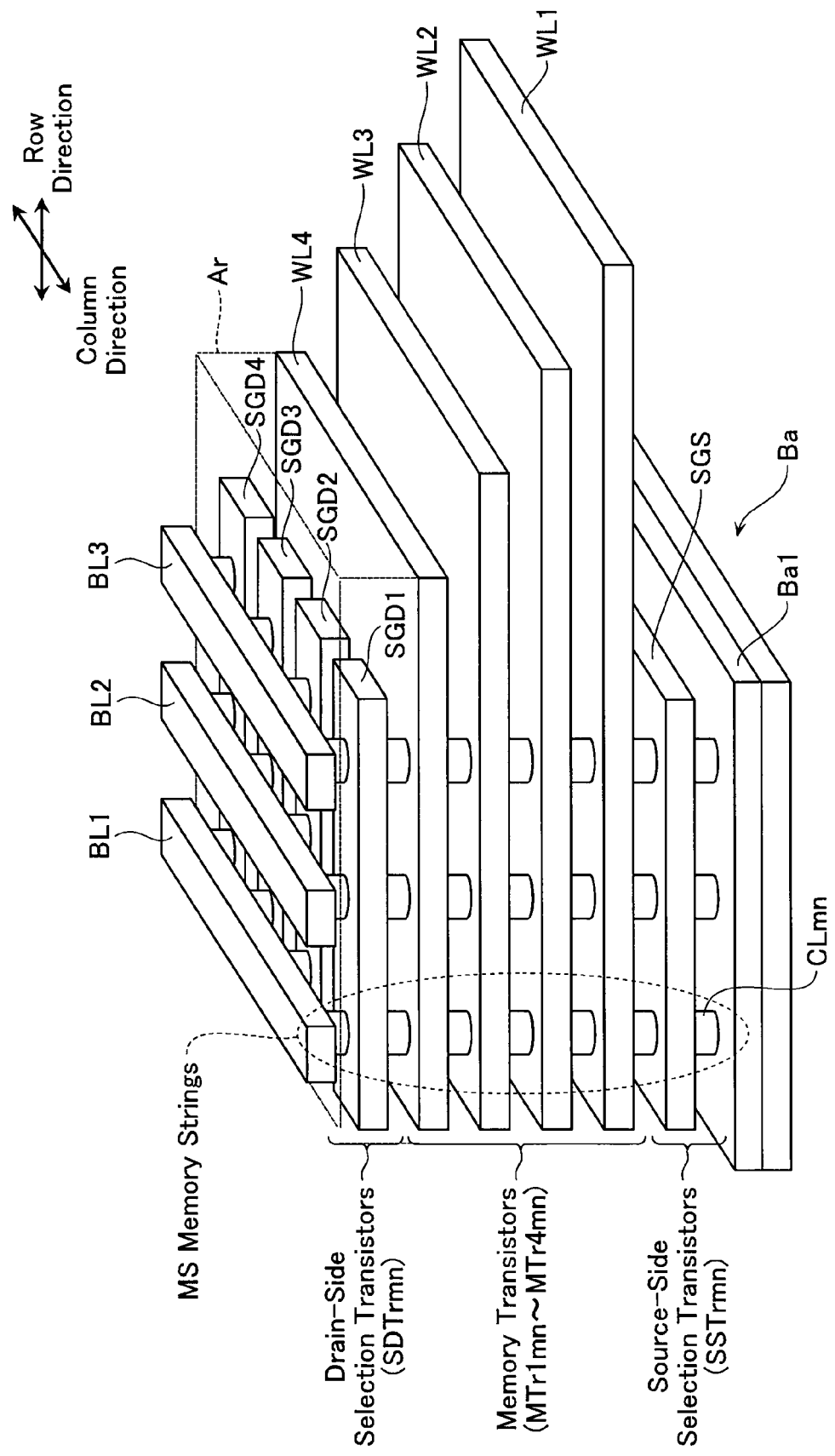
FIG. 2 is a perspective view schematically illustrating a part of the memory transistor area 12 in the non-volatile semiconductor storage device according to the first embodiment of the present invention.
Figure 3:
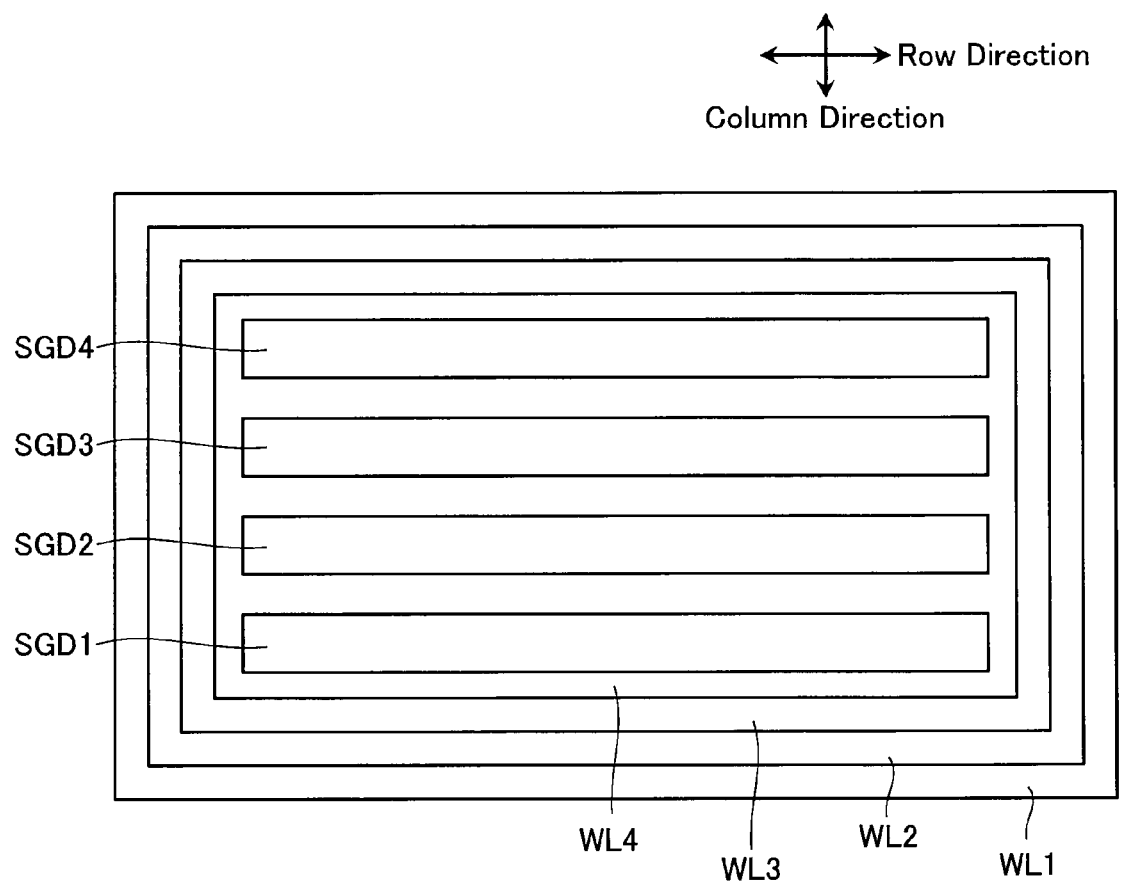
FIG. 3 is a top plan view schematically illustrating a part of the memory transistor area 12 in the non-volatile semiconductor storage device according to the first embodiment of the present invention.

FIG. 2 is a schematic configuration diagram illustrating a part of the memory transistor area 12 in the non-volatile semiconductor storage device 100 according to the first embodiment; and FIG. 3 is a top plan view schematically illustrating a part of the memory transistor area 12. According to the first embodiment, the memory transistor area 12 has m×n (m, n=natural number) memory strings MS including memory transistors MTr1$mn$ to MTr4$mn$ as well as a source-side selection transistor SSTrmn and drain-side selection transistors SDTrmn. In FIG. 2, given that m=3, n=4.

In each of the memory strings MS, each of word lines WL1 to WL4 connected to the gate of each of the memory transistors MTr1$mn$ to MTr4$mn$ is formed by the same conductive film and used in common therein. That is, in each of the memory strings MS, all gates of the memory transistor MTr1$mn$ are connected to the word line WL1. In addition, in each of the memory strings MS, all gates of the memory transistor MTr2$mn$ are connected to the word line WL2. In addition, in each of the memory strings MS, all gates of the memory transistor MTr3$mn$ are connected to the word line WL3. In addition, in each of the memory strings MS, all gates of the memory transistor MTr4$mn$ are connected to the word line WL4. As illustrated in FIGS. 1 to 3, in the non-volatile semiconductor storage device 100 according to the first embodiment, each of the word lines WL1 to WL4 expands in a two-dimensional manner and has a planar plate-like structure. In addition, the word lines WL1 to WL4 are arranged substantially vertical to the respective memory strings MS. In addition, the row-direction (first direction) and column-direction ends of the word lines WL1 to WL4 are formed in a stepwise manner in relation to each other. Wherein, the row direction represents a direction orthogonal to the vertical direction and the column direction represents another orthogonal to the vertical direction and the row direction.

Each of the memory strings MS has columnar semiconductors CLmn (in the case of FIG. 2, m=1 to 3, n=1 to 4) provided on an $n^+$ area that is formed on a P-well area Ba1 on a semiconductor substrate Ba. The columnar semiconductors CLmn are formed in a vertical direction to the semiconductor substrate Ba and arranged in a matrix form on the respective surfaces of the semiconductor substrate Ba and the word lines WL1 to WL4. That is, the memory strings MS are also arranged in a matrix form within a plane vertical to the columnar semiconductors CLmn. Note that the columnar semiconductors CLmn may be columnar or prismatic in shape. In addition, the columnar semiconductors CLmn include terraced columnar semiconductors.

Further, as illustrated in FIGS. 2 and 3, provided on the upper portions of the memory strings MS are drain-side selection gate lines SGD with rectangular plate shapes (in the case of FIG. 2, SGD1 to SGD4), which contact columnar semiconductors CLmn via insulating films (not illustrated) to configure respective drain-side selection transistors SDTrmn. The drain-side selection gate lines SGD are insulated and isolated from each other and, unlike the word lines WL1 to WL4, formed in a stripe pattern extending in the row direction (in lines repeatedly provided in the column direction). In addition, columnar semiconductors CLmn are provided to penetrate the center in the width direction of the drain-side selection gate lines SGD. In this case, the row-direction ends of the word lines WL1 to WL4 are formed to protrude outward compared to the row-direction ends of the drain-side selection gate lines SGD. In other words, the entire drain-side selection gate lines SGD are formed in an area Ar immediately above the word line WL4 on the top layer. More specifically, the entire drain-side selection gate lines SGD are formed in the rectangular-parallelepiped area Ar with its bottom surface coinciding with the top surface of the word line WL4 on the top layer.

Further, as illustrated in FIG. 2, provided on the lower portions of the memory strings MS is a source-side selection gate line SGS, which contact the columnar semiconductors CLmn via insulating films (not illustrated) to configure respective source-sides election transistors SSTrmn. As with the word lines WL1 to WL4, the source-side selection gate line SGS has a planar plate-like structure expanding in a two-dimensional manner.

Figure 4:
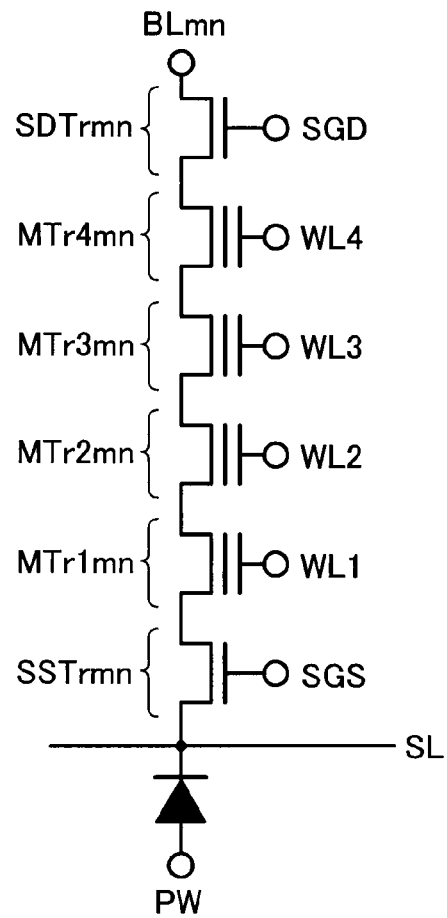
FIG. 4 is a circuit diagram illustrating one memory string MS according to the first embodiment of the present invention.

Referring now to FIGS. 2 and 3, the circuit configuration and operation of the memory strings MS of the first embodiment will be described below. FIG. 4 is a circuit diagram illustrating one memory string MS according to the first embodiment.

As illustrated in FIGS. 2 to 4, in the first embodiment, each of the memory strings MS has four memory transistors MTr1$mn$ to MTr4$mn$ as well as the source-side selection transistor SSTrmn and the drain-side selection transistor SDTrmn. These four memory transistors MTr1$mn$ to MTr4$mn$ as well as the source-side selection transistor SSTrmn and the drain-side selection transistor SDTrmn are connected in series to each other (see FIG. 4). According to the first embodiment, in each of the memory strings MS, a columnar semiconductor CLmn is formed on an $n^+$ area that is formed on the $p^-$ type area (P-well area) Ba1 on the semiconductor substrate Ba.

In addition, a source line SL (an $n^+$ area formed on the P-well area Ba1 on the semiconductor substrate Ba) is connected to the source of each source-side selection transistor SSTrmn. Further, a bit line BL is connected to the drain of each drain-side selection transistor SDTrmn.

Each of the memory transistors MTrmn has a columnar semiconductor CLmn, a charge trap layer (memory layer) formed to surround the columnar semiconductor CLmn, and a word line WL formed to surround the charge trap layer. The end of each word line WL that contacts the charge trap layer surrounded by the insulation film functions as a control gate electrode of the corresponding memory transistor MTrmn. The sources and drains of the memory transistors MTrmn are formed at the columnar semiconductors CLmn.

In the non-volatile semiconductor storage device 100 with the above-mentioned configuration, respective voltages of the bit lines BL1 to BL3, the drain-side selection gate lines SGD, the word lines WL1 to WL4, the source-side selection gate line SGS, and the source lines SL are controlled by bit line driving circuits (not illustrated), the drain-side selection gate line driving circuit 15, the word line driving circuits 13, the source-side selection gate line driving circuit 14, and a source line driving circuit (not illustrated). That is, data is read, written and erased by controlling charges of the charge trap layer in a predetermined memory transistor MTrmn.

Figure 5:
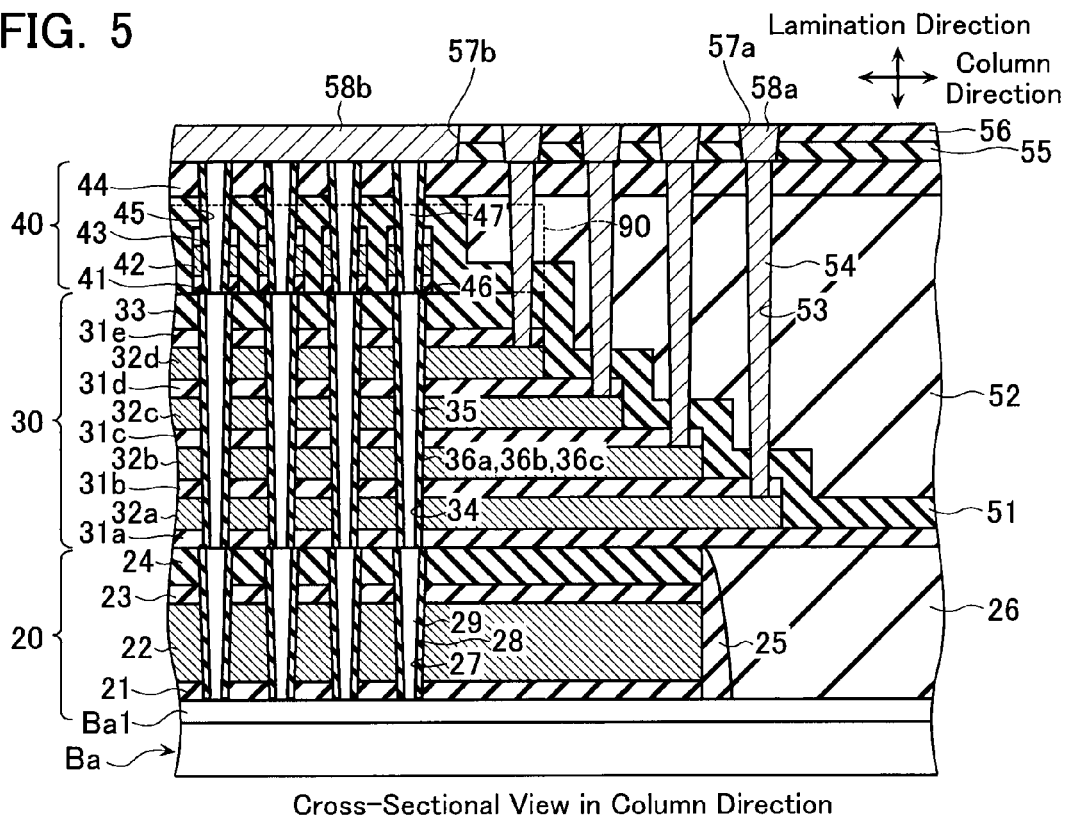
FIG. 5 illustrates a cross-sectional structure in the column direction of the non-volatile semiconductor storage device according to the first embodiment.
Figure 6:
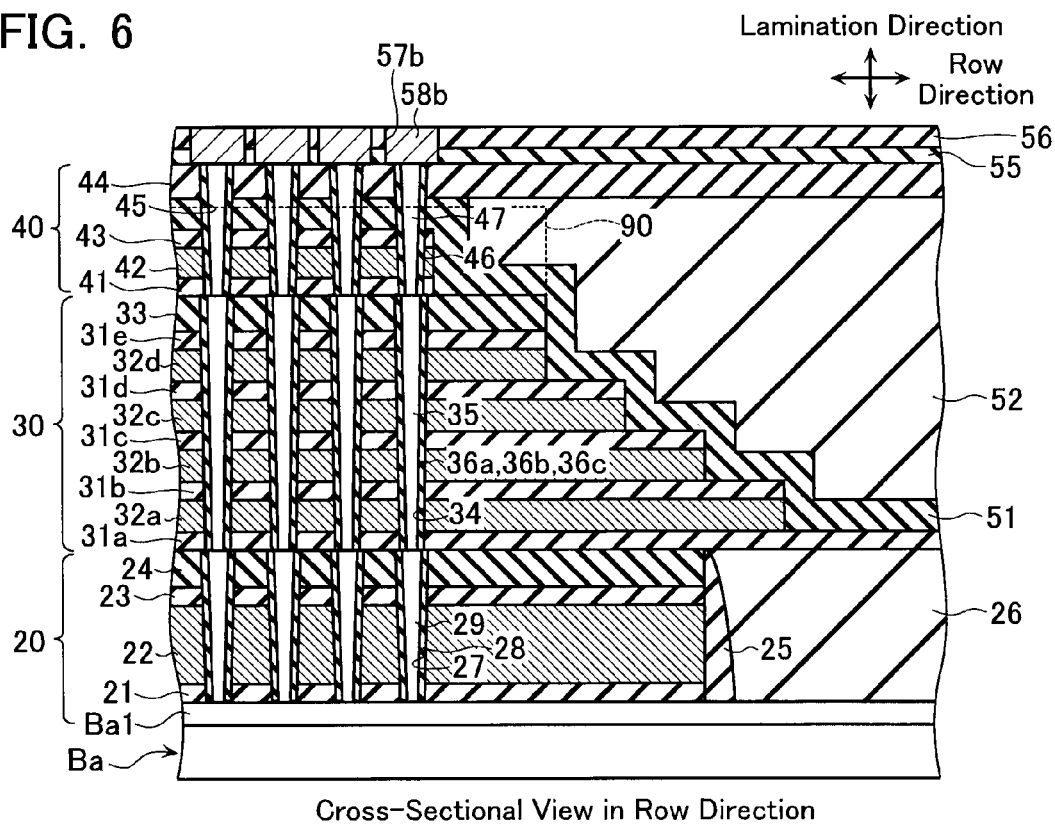
FIG. 6 illustrates a cross-sectional structure in the row direction of the non-volatile semiconductor storage device according to the first embodiment.

Specific Configuration of Non-Volatile Semiconductor Storage Device 100 in First Embodiment Referring now to FIGS. 5 and 6, a further specific configuration of the non-volatile semiconductor storage device 100 will be described below. FIG. 5 illustrates a cross-sectional structure in the column direction of the non-volatile semiconductor storage device according to the first embodiment; and FIG. 6 is a cross-sectional view in the row direction of the non-volatile semiconductor storage device according to the first embodiment. As illustrated in FIGS. 5 and 6, the memory strings MS have, from lower layer to upper layer, a source-side selection transistor layer 20, a memory transistor layer 30, and a drain-side selection transistor layer 40. The source-side selection transistor layer 20 functions as a source-side selection transistor SSTrmn. The memory transistor layer 30 functions as a memory transistor MTrmn. The drain-side selection transistor layer 40 functions as a drain-side selection transistor SDTrmn.

The source-side selection transistor layer 20 has a source-side first insulation layer 21, a source-side conductive layer 22, a source-side second insulation layer 23, and a source-side isolation/insulation layer 24 that are sequentially laminated on the semiconductor substrate Ba. The source-side first insulation layer 21 and the source-side second insulation layer 23 are composed of silicon oxide ($SiO_2$). The source-side conductive layer 22 is composed of polysilicon (p-Si). The source-side isolation/insulation layer 24 is composed of silicon nitride (SiN). The source-side first insulation layer 21, the source-side conductive layer 22, the source-side second insulation layer 23, and the source-side isolation/insulation layer 24 are arranged separately for each predetermined area (erase unit) in the memory transistor area 12. In addition, a sidewall insulation layer 25 is formed on the respective side surfaces at the row- and column-direction ends of the source-side first insulation layer 21, the source-side conductive layer 22, the source-side second insulation layer 23, and the source-side isolation/insulation layer 24. Further, an interlayer insulation layer 26 is formed ranging from the semiconductor substrate Ba to the top surface of the source-side isolation/insulation layer 24.

In addition, the source-side selection transistor layer 20 has source-side holes 27 formed therein so as to penetrate the source-side isolation/insulation layer 24, the source-side second insulation layer 23, the source-side conductive layer 22, and the source-side first insulation layer 21. The source-side holes 27 have source-side columnar semiconductor layers 29 provided therein via source-side gate insulation layers 28. The source-side columnar semiconductor layers 29 are formed in contact with the bottom surfaces of memory columnar semiconductor layers 35 described below and formed to extend in a substantially vertical direction to the semiconductor substrate Ba. The source-side gate insulation layers 28 are formed by silicon oxide (SiO$_2$). The source-side columnar semiconductor layers 29 are formed by polysilicon (p-Si).

In the source-side selection transistor layer 20, the source-side conductive layer 22 functions as the source-side selection gate line SGS. In addition, the source-side conductive layer 22 functions as the control gate of the source-side selection transistor SSTrmn.

The memory transistor layer 30 has first to fifth inter-wordline insulating layers (first interlayer insulation layers) 31a to 31e that are provided over the source-side isolation/insulation layer 24 and the interlayer insulation layer 26, first to fourth wordline conductive layers (first conductive layers) 32a to 32d that are provided one above the other with the first to fifth inter-wordline insulating layers 31a to 31e, as well as a memory isolation/insulation layer 33 that is provided on the fifth inter-wordline insulating layer 31e. The first to fifth inter-wordline insulating layers 31a to 31e are composed of silicon oxide (SiO$_2$). In addition, the first to fourth wordline conductive layers 32a to 32d are composed of polysilicon (p-Si). In addition, the memory isolation/insulation layer 33 is composed of silicon nitride (SiN).

Further, in the memory transistor layer 30, the row-direction ends of the first to fourth wordline conductive layers 32a to 32d are formed in a stepwise manner in relation to each other. Specifically, in this stepwise configuration, the respective ends of the first wordline conductive layer 32a and the second inter-wordline insulating layer 31b are formed in alignment with each other. In addition, the respective ends of the second wordline conductive layer 32b and the third inter-wordline insulating layer 31c are formed in alignment with each other. In addition, the respective ends of the third wordline conductive layer 32c and the fourth inter-wordline insulating layer 31d are formed in alignment with each other. In addition, the respective ends of the fourth wordline conductive layer 32d, the fifth inter-wordline insulating layer 31e, and the memory isolation/insulation layer 33 are formed in alignment with each other.

Further, in the memory transistor layer 30, the side surfaces of the first to fourth wordline conductive layers 32a to 32d are covered with a protection insulation layer 51 that is formed continuously with the first to fourth wordline conductive layers 32a to 32d as well as a drain-side conductive layer 42 described below. The respective side surfaces of the second to fifth inter-wordline insulating layers 31b to 31e and the memory isolation/insulation layer 33 are also covered with the protection insulation layer 51. The top surfaces of the first to fourth inter-wordline insulating layers 31a to 31d adjacent to the row- and column-direction ends (those portions formed in a stepwise manner in relation to each other) as well as the top surface of the memory isolation/insulation layer 33 adjacent to the row- and column-direction ends (those portions formed in a stepwise manner in relation to each other) are also covered with the protection insulation layer 51. In addition, in the memory transistor layer 30, an interlayer insulation layer 52 is formed on the protection insulation layer 51.

Further, the memory transistor layer 30 has memory holes (holes) 34 that are formed to penetrate the memory isolation/insulation layer 33, the first to fifth inter-wordline insulating layers 31a to 31e, and the first to fourth wordline conductive layers 32a to 32d, and memory columnar semiconductor layers (first columnar semiconductor layers) 35 that are formed in the memory holes 34. The memory columnar semiconductor layers 35 are formed by polysilicon (p-Si). The memory columnar semiconductor layers 35 are formed in contact with the upper portions of the respective source-side columnar semiconductor layers 29 and formed to extend in a substantially vertical direction to the semiconductor substrate Ba.

Figure 7:
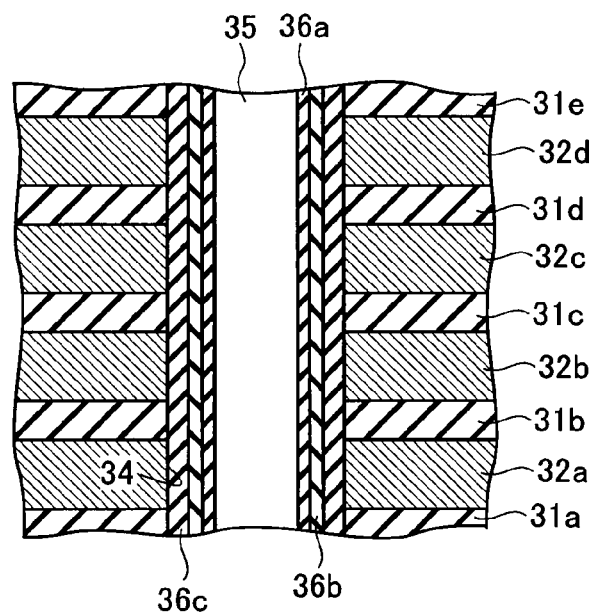
FIG. 7 is an enlarged view of FIG. 5.

Further, as illustrated in FIG. 7 (enlarged view of FIG. 5), the memory transistor layer 30 has tunnel insulation layers 36a that are formed in contact with the memory columnar semiconductor layers 35, charge trap layers 36b that are formed in contact with the tunnel insulation layers 36a, and block insulation layers 36c that are formed in contact with the charge trap layers 36b. Note that the block insulation layers 36c contact the first to fourth wordline conductive layers 32a to 32d. The tunnel insulation layers 36a are formed by silicon oxide (SiO$_2$). The charge trap layers 36b are formed by silicon nitride (SiN). The block insulation layers 36c are formed by silicon oxide (SiO$_2$).

In the memory transistor layer 30, the first to fourth wordline conductive layers 32a to 32d function as the word lines WL1 to WL4. In addition, the first to fourth wordline conductive layers 32a to 32d function as the control gates of the memory transistors MTr1mn to Mtr4mn.

The configuration of the memory transistor layer 30 is restated as follows: the charge trap layers 36b are formed to sandwich the tunnel insulation layers 36a with the memory columnar semiconductor layers 35. In addition, the first to fourth wordline conductive layers 32a to 32d are formed to sandwich the block insulation layers 36c with the charge trap layers 36b.

The drain-side selection transistor layer 40 has a drain-side first insulation layer (second interlayer insulation layer) 41 that is provided on the top surfaces of the memory columnar semiconductor layers 35 and formed in a stripe pattern extending in the row direction (in lines repeatedly provided in the column direction), as well as a drain-side conductive layer (second conductive layer) 42 and a drain-side second insulation layer (second interlayer insulation layer) 43 that are sequentially provided on the top surface of the drain-side first insulation layer 41. Note that the drain-side conductive layer 42 and the drain-side second insulation layer 43 are provided at positions matching the upper portions of the memory columnar semiconductor layers 35 and formed in a stripe pattern extending in the row direction, as in the drain-side first insulation layer 41. The drain-side first insulation layer 41 and the drain-side second insulation layer 43 are formed by silicon oxide (SiO$_2$). The drain-side conductive layer 42 is formed by polysilicon (p-Si).

In addition, in the drain-side selection transistor layer 40, the side surface of the drain-side conductive layer 42 is covered with the protection insulation layer 51 that is formed continuously with the drain-side conductive layer 42 and the first to fourth wordline conductive layers 32a to 32d. The respective side surfaces of the drain-side first insulation layer 41 and the drain-side second insulation layer 43 are also covered with the protection insulation layer 51. The top surfaces of the drain-side second insulation layer 43 are also covered with the protection insulation layer 51. In this case, the first to fourth wordline conductive layers 32a to 32d have their ends formed to protrude outward compared to the row-direction end of the drain-side conductive layer 42. In other words, the entire drain-side conductive layer 42 is formed in an area 90 immediately above the fourth wordline conductive layer 32d on the top layer. More specifically, the entire drain-side conductive layer 42 is formed in the rectangular-parallelepiped area 90 with its bottom surface coinciding with the top surface of the fourth wordline conductive layer 32d on the top layer.

In addition, in the drain-side selection transistor layer 40, the interlayer insulation layer 52 is formed to a height comparable to the top surface of the protection insulation layer 51 located above the drain-side second insulation layer 43. A drain-side third insulation layer 44 is formed on the upper portions of the interlayer insulation layer 52 and the protection insulation layer 51.

In addition, the drain-side selection transistor layer 40 has drain-side holes 45 formed therein so as to penetrate the drain-side third insulation layer 44, the protection insulation layer 51, the drain-side second insulation layer 43, the drain-side conductive layer 42, and the drain-side first insulation layer 41. The drain-side holes 45 have drain-side columnar semiconductor layers (second columnar semiconductor layers) 47 provided therein via drain-side gate insulation layers 46. The drain-side columnar semiconductor layers 47 are formed in contact with the top surfaces of the memory columnar semiconductor layers 35 and formed to extend in a substantially vertical direction to the semiconductor substrate Ba. The drain-side gate insulation layers 46 are formed by silicon oxide (SiO$_2$). The drain-side columnar semiconductor layers 47 are formed by polysilicon (p-Si).

In the drain-side selection transistor layer 40, the drain-side conductive layer 42 functions as the drain-side selection gate lines SGD. In addition, the drain-side conductive layer 42 functions as the control gate of the corresponding drain-side selection transistor SDTrmn.

The configuration of the drain-side selection transistor layer 40 is restated as follows. The drain-side conductive layer 42 is formed to sandwich the drain-side gate insulation layers 46 with the drain-side columnar semiconductor layers 47.

In addition, in the memory transistor layer 30 and the drain-side selection transistor layer 40, plug holes 53 are formed to penetrate the drain-side third insulation layer 44, the interlayer insulation layer 52, the protection insulation layer 51, and the first to fifth inter-wordline insulating layers 31a to 31e (as well as the memory isolation/insulation layer 33), so that the top surfaces of the first to fourth wordline conductive layers 32a to 32d are exposed. The plug holes 53 have plug conductive layers 54 formed therein. The plug conductive layers 54 are formed by Ti, TiN/W. The protection insulation layer 51 is formed with the same thickness either on the first to fourth wordline conductive layers 32a to 32d and on the drain-side conductive layer 42.

A first plug insulation layer 55 and a second plug insulation layer 56 are laminated on the top surfaces of the plug conductive layers 54. The first plug insulation layer 55 is formed by silicon nitride (SiN), while the second plug insulation layer 56 is formed by silicon oxide (SiO$_2$). In addition, the first plug insulation layer 55 and the second plug insulation layer 56 have first wiring trenches 57a that are formed to penetrate therein at positions matching the plug conductive layers 54. The first plug insulation layer 55 and the second plug insulation layer 56 also have second wiring trenches 57b that are formed to penetrate therein at positions matching the drain-side columnar semiconductor layers 47 and formed in a stripe pattern extending in the column direction. The first wiring trenches 57a and the second wiring trenches 57b have first wiring layers 58a and second wiring layers 58b formed therein. The first wiring layers 58a and the second wiring layers 58b are formed by Ti, TiN/W.

Manufacturing Process of Non-Volatile Semiconductor Storage Device 100 in First Embodiment Referring now to FIGS. 8 to 19, the manufacturing process of the non-volatile semiconductor storage device 100 according to the first embodiment will be described below.

Figure 8:
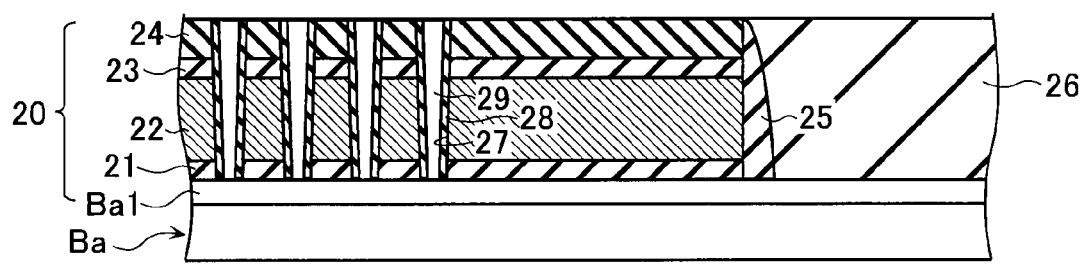
FIG. 8 is a cross-sectional view of the non-volatile semiconductor storage device in a manufacturing process according to the first embodiment.

Firstly, as illustrated in FIG. 8, a source-side selection transistor layer 20 is formed on the semiconductor substrate Ba.

Figure 9:
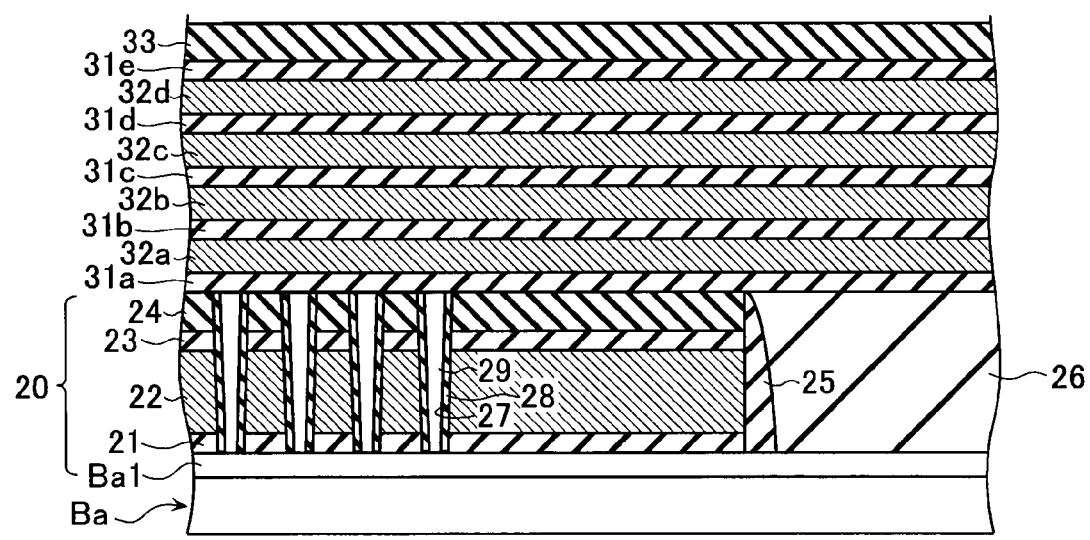
FIG. 9 is a cross-sectional view of the non-volatile semiconductor storage device in the manufacturing process according to the first embodiment.

Then, as illustrated in FIG. 9, polysilicon (p-Si) and silicon oxide (SiO$_2$) are alternately laminated on the source-side selection transistor layer 20 and then silicon nitride (SiN) is deposited thereon to form first to fifth inter-wordline insulating layers 31a to 31e, first to fourth wordline conductive layers 32a to 32d, and a memory isolation/insulation layer 33.

Figure 10:
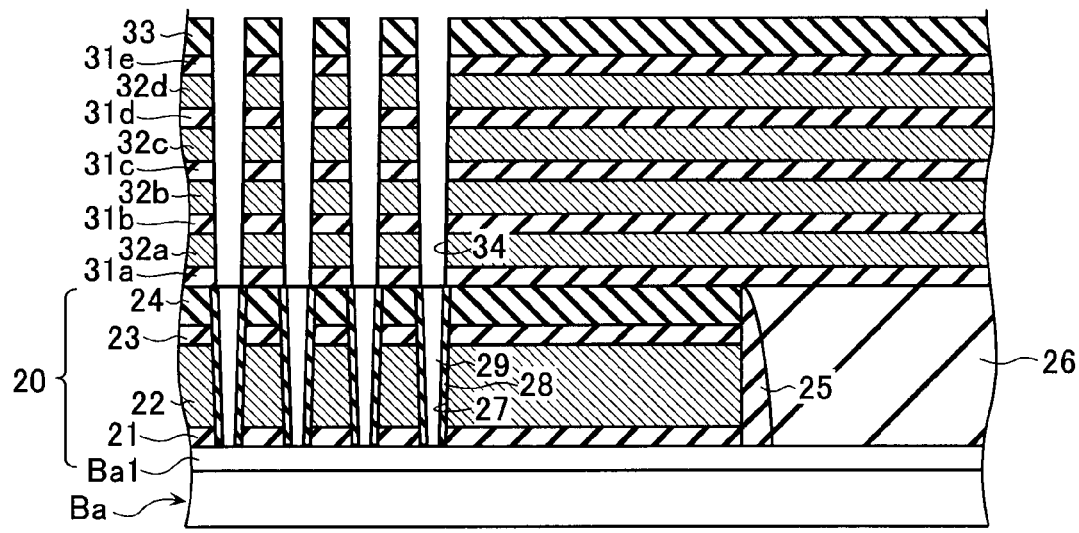
FIG. 10 is a cross-sectional view of the non-volatile semiconductor storage device in the manufacturing process according to the first embodiment.

Then, as illustrated in FIG. 10, memory holes 34 are formed to penetrate the memory isolation/insulation layer 33, the first to fifth inter-wordline insulating layers 31a to 31e, and the first to fourth word line conductive layers 32a to 32d. The memory holes 34 are formed at positions matching the source-side holes 27.

Figure 11:
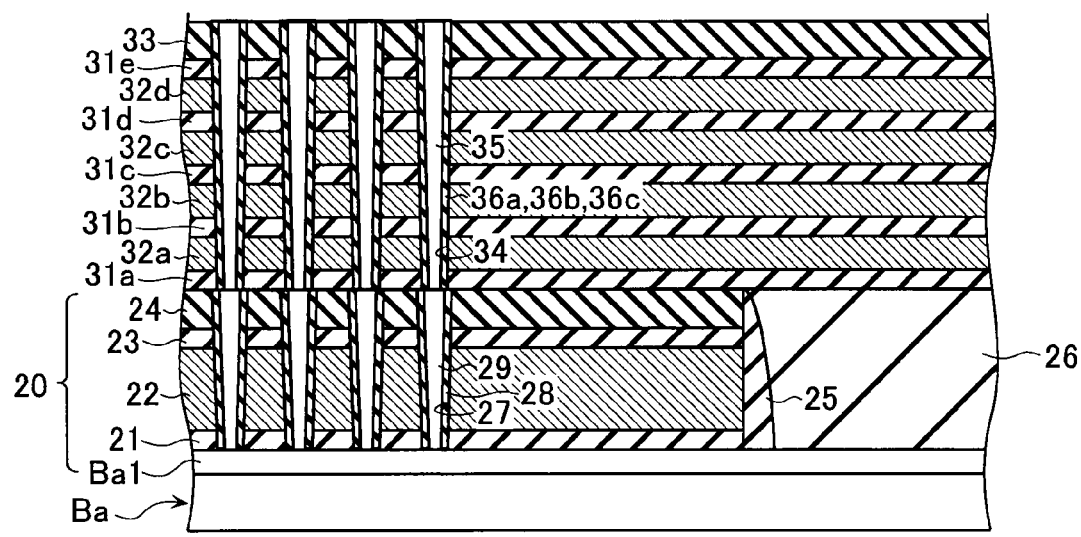
FIG. 11 is a cross-sectional view of the non-volatile semiconductor storage device in the manufacturing process according to the first embodiment.

Then, as illustrated in FIG. 11, silicon oxide (SiO$_2$), silicon nitride (SiN), and silicon oxide (SiO$_2$) are sequentially laminated in the memory holes 34 to form tunnel insulation layers 36a, charge trap layers 36b, and block insulation layers 36c. Subsequently, those portions of the tunnel insulation layers 36a, the charge trap layers 36b, the block insulation layers 36c, and any natural oxide film are removed that are formed on the bottom portions of the memory holes 34 and on the upper portion of the memory isolation/insulation layer 33. Thereafter, amorphous silicon (a-Si) is deposited in the memory holes 34, on which heat treatment is then performed to form memory columnar semiconductor layers 35.

Figure 12:
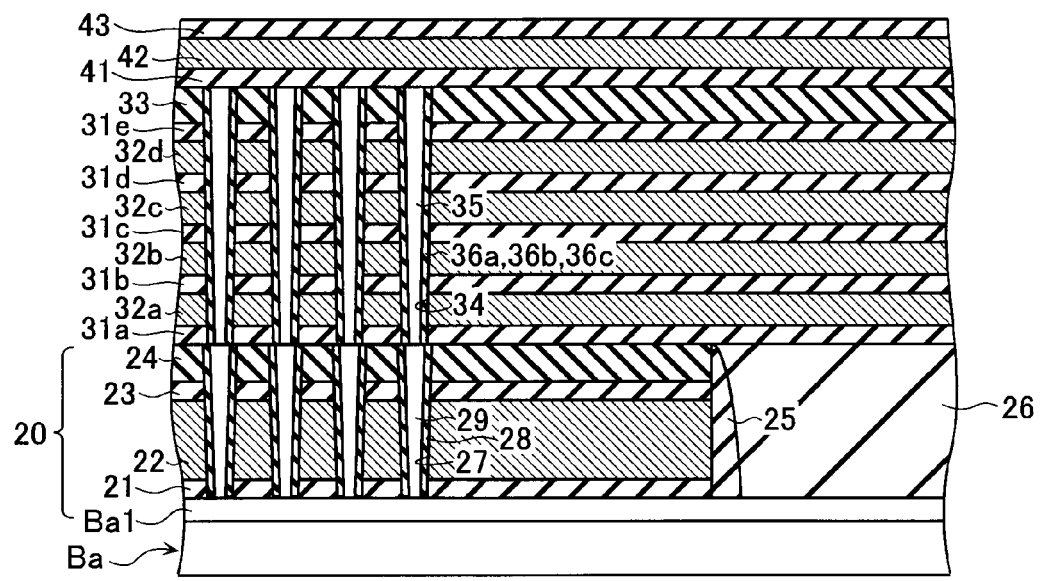
FIG. 12 is a cross-sectional view of the non-volatile semiconductor storage device in the manufacturing process according to the first embodiment.

Then, as illustrated in FIG. 12, silicon oxide (SiO$_2$) (e.g., 20 nm), polysilicon (p-Si) (e.g., 200 nm), and silicon oxide (SiO$_2$) (e.g., 15 nm) are sequentially laminated on the memory isolation/insulation layer 33 by Low Pressure Chemical Vapor Deposition (LPCVD), thereby forming a drain-side first insulation layer 41, a drain-side conductive layer 42, and a drain-side second insulation layer 43.

Figure 13:
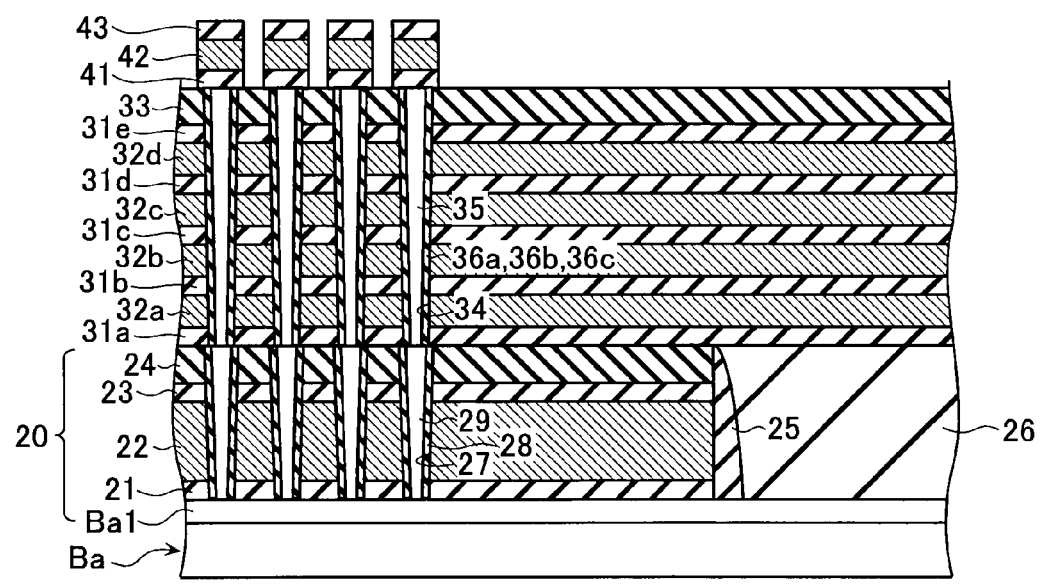
FIG. 13 is a cross-sectional view of the non-volatile semiconductor storage device in the manufacturing process according to the first embodiment.

Then, as illustrated in FIG. 13, Reactive Ion Etching (RIE) is performed thereon using resist as mask material. In this step illustrated in FIG. 13, the drain-side first insulation layer 41, the drain-side conductive layer 42, and the drain-side second insulation layer 43 are provided at positions matching the upper portions of the memory columnar semiconductor layers 35 and formed in a stripe pattern extending in the row direction. Note that the step of FIG. 13 is hereinafter referred to as a "step of processing drain-side selection gates".

Figure 14:
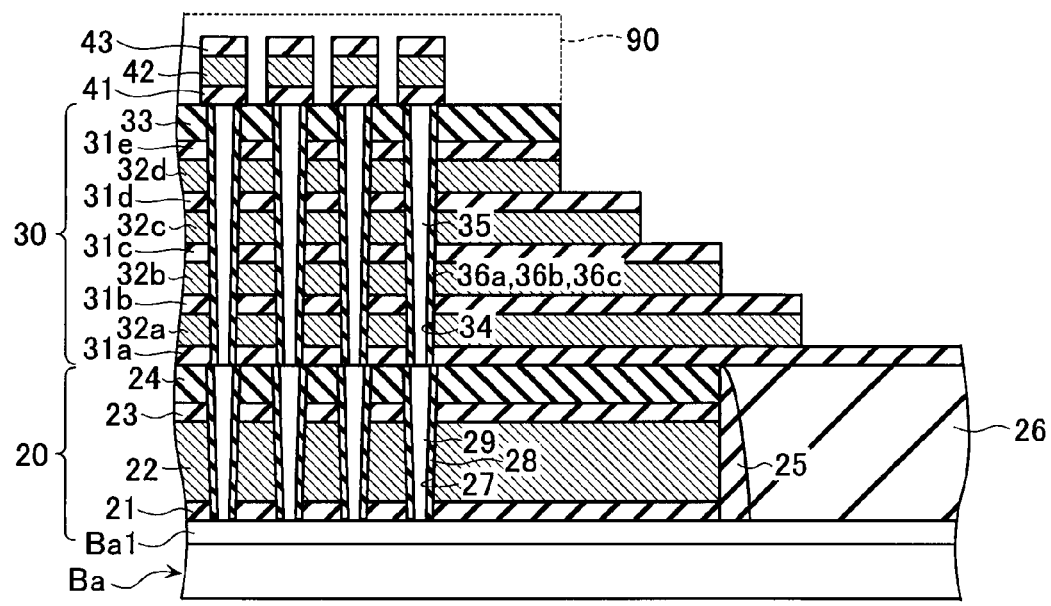
FIG. 14 is a cross-sectional view of the non-volatile semiconductor storage device in the manufacturing process according to the first embodiment.

Then, lithography and etching processes are performed as illustrated in FIG. 14, by which the row-direction ends of the second to fifth inter-wordline insulating layers 31b to 31e, the row-direction ends of the first to fourth wordline conductive layers 32a to 32d, and the row-direction end of the memory isolation/insulation layer 33 are formed in a stepwise manner in relation to each other. In this case, the respective ends of the first wordline conductive layer 32a and the second inter-wordline insulating layer 31b are formed in alignment with each other. In addition, the respective ends of the second wordline conductive layer 32b and the third inter-wordline insulating layer 31c are formed in alignment with each other. In addition, the respective ends of the third wordline conductive layer 32c and the fourth inter-wordline insulating layer 31d are formed in alignment with each other. In addition, the respective ends of the fourth wordline conductive layer 32d, the fifth inter-wordline insulating layer 31e, and the memory isolation/insulation layer 33 are formed in alignment with each other.

Further, in the step of FIG. 14, the second to fifth inter-wordline insulating layers 31b to 31e, the first to fourth wordline conductive layers 32a to 32d, and the memory isolation/insulation layer 33 are formed in such a way that the drain-side first insulation layer 41, the drain-side conductive layer 42, and the drain-side second insulation layer 43 are provided in the area 90 immediately above the fourth wordline conductive layer 32d on the top layer in their entirety. Note that the area 90 is a rectangular-parallelepiped area with its bottom surface coinciding with the top surface of the fourth wordline conductive layer 32d on the top layer.

Figure 15:
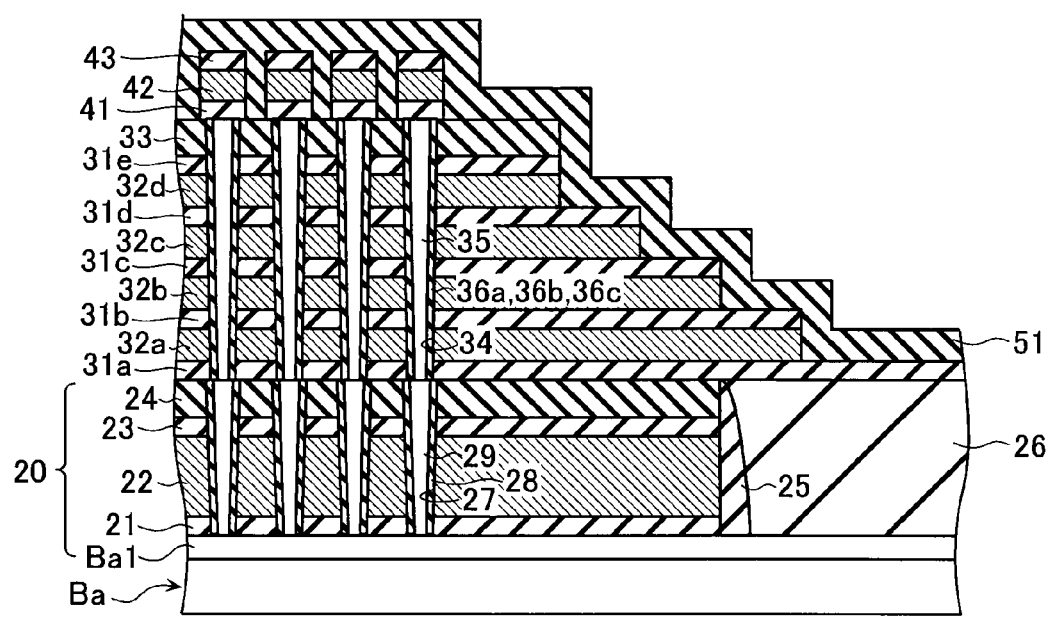
FIG. 15 is a cross-sectional view of the non-volatile semiconductor storage device in the manufacturing process according to the first embodiment.

Then, as illustrated in FIG. 15, silicon nitride (SiN) (e.g., 150 nm) is deposited by LPCVD to form a protection insulation layer 51. The protection insulation layer 51 is formed to cover the respective side surfaces of the second to fifth inter-wordline insulating layers 31b to 31e, the first to fourth wordline conductive layers 32a to 32d, the drain-side first insulation layer 41, the drain-side conductive layer 42, and the drain-side second insulation layer 43. In addition, the protection insulation layer 51 is formed to cover the exposed top surfaces of the first to fourth inter-wordline insulating layers 31a to 31d, the exposed top surface of the memory isolation/insulation layer 33, and the top surface of the drain-side second insulation layer 43.

Figure 16:
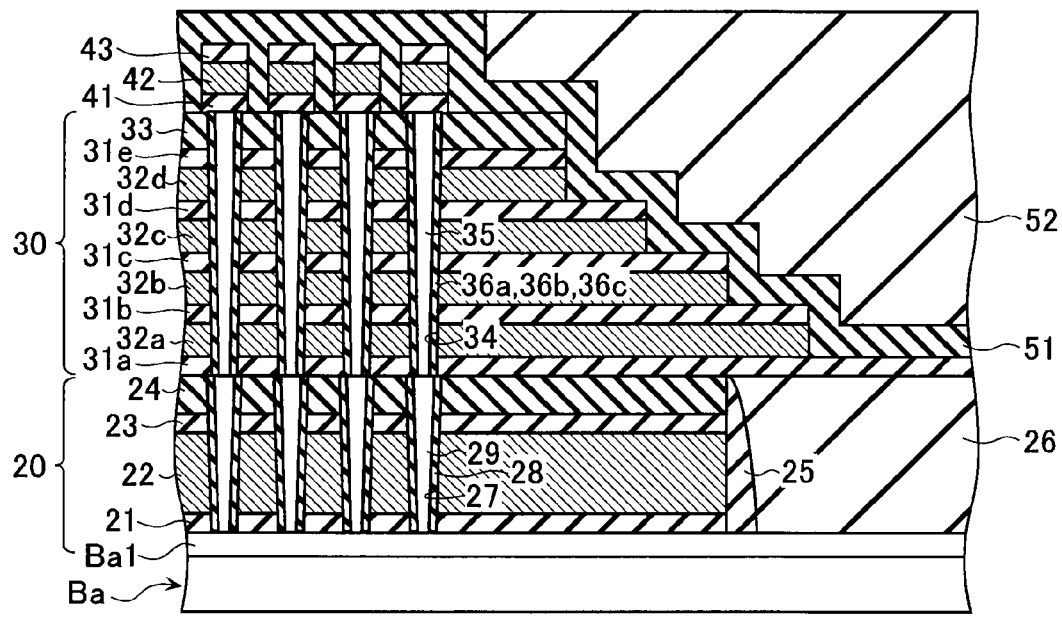
FIG. 16 is a cross-sectional view of the non-volatile semiconductor storage device in the manufacturing process according to the first embodiment.

Then, as illustrated in FIG. 16, an interlayer insulation layer 52 (e.g., BPSG) is deposited to the top surface of the top protection insulation layer 51 and the resulting surface is flattened by CMP. In this case, the protection insulation layer 51 serves a stopper in the CMP process.

Figure 17:
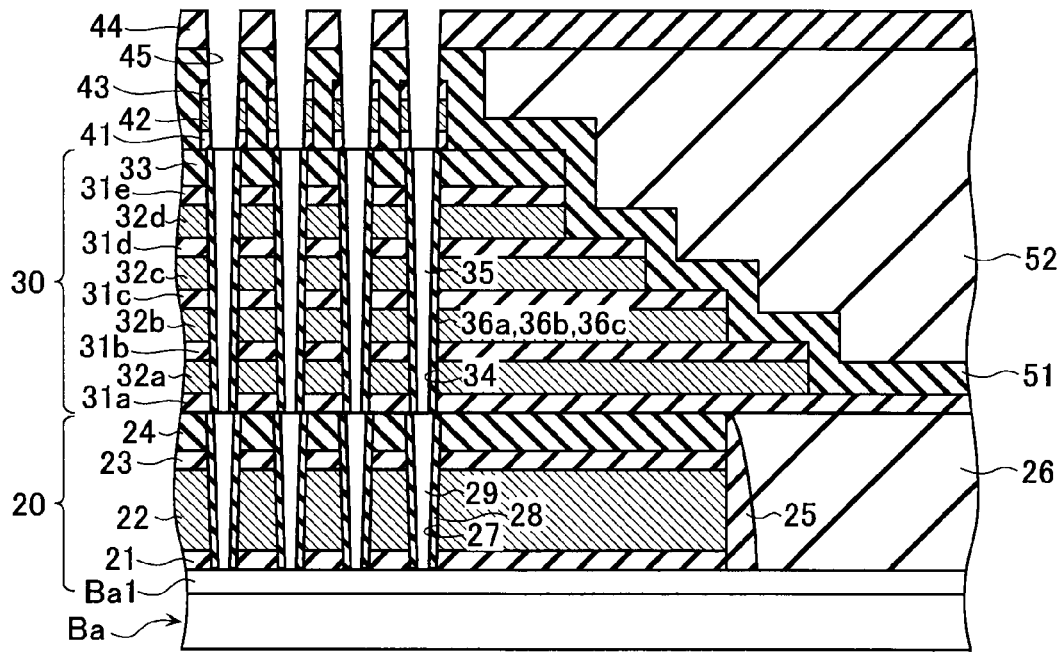
FIG. 17 is a cross-sectional view of the non-volatile semiconductor storage device in the manufacturing process according to the first embodiment.

Then, as illustrated in FIG. 17, silicon oxide ($SiO_2$) (e.g., 300 nm) is deposited on the respective top surfaces of the protection insulation layer 51 and the interlayer insulation layer 52 to form a drain-side third insulation layer 44. Then, drain-side holes 45 are formed at positions matching the memory columnar semiconductor layers 35 by lithography and etching processes so as to penetrate the drain-side third insulation layer 44, the protection insulation layer 51, the drain-side second insulation layer 43, the drain-side conductive layer 42, and the drain-side first insulation layer 41.

Figure 18:
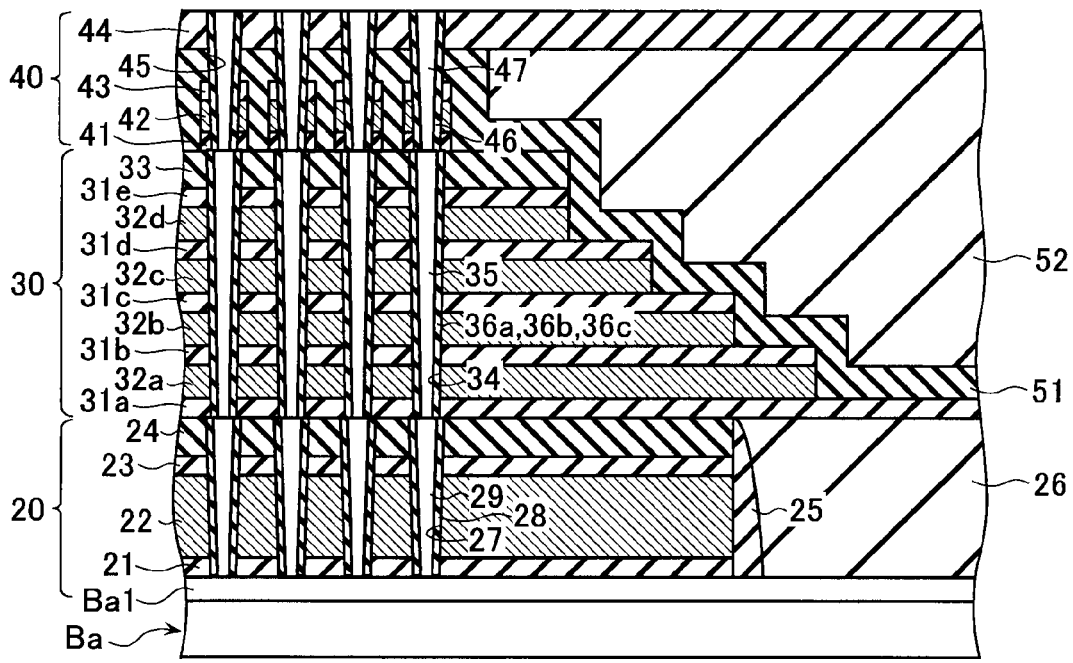
FIG. 18 is a cross-sectional view of the non-volatile semiconductor storage device in the manufacturing process according to the first embodiment.

Then, as illustrated in FIG. 18, silicon oxide ($SiO_2$) is deposited in the drain-side holes 45 to form drain-side gate insulation layers 46. Then, those portions of the drain-side gate insulation layers 46 and any natural oxide film are removed that are formed on the bottom surfaces of the drain-side holes 45 and on the upper portion of the drain-side third insulation layer 44. Thereafter, amorphous silicon (a-Si) is deposited in the drain-side holes 45, on which heat treatment is then performed to form drain-side columnar semiconductor layers 47.

Figure 19:
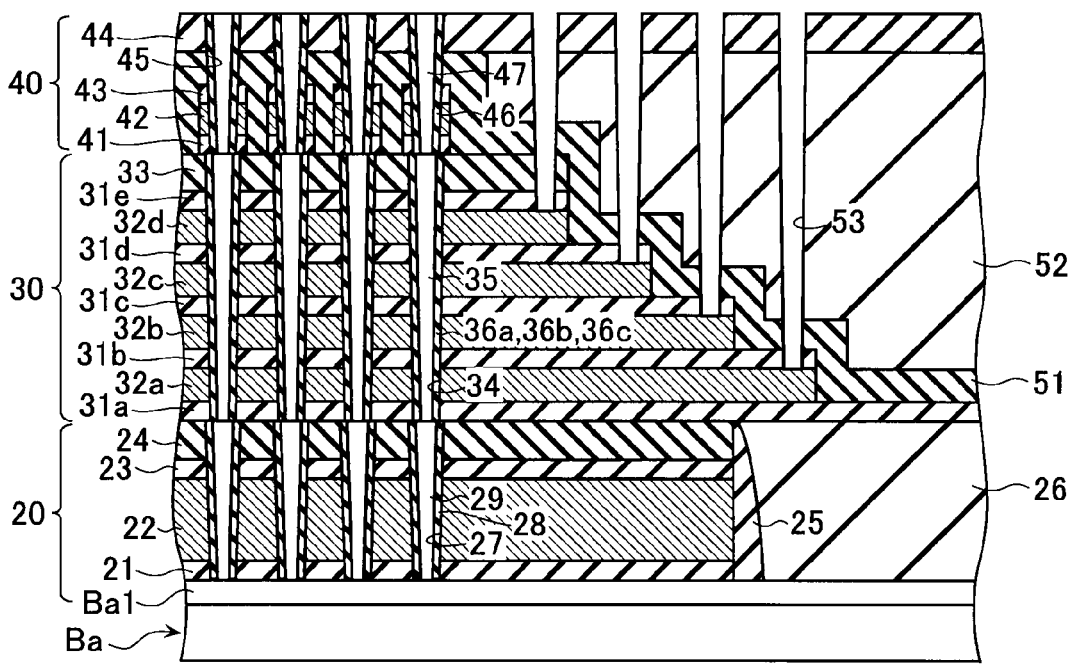
FIG. 19 is a cross-sectional view of the non-volatile semiconductor storage device in the manufacturing process according to the first embodiment.

Then, as illustrated in FIG. 19, plug holes 53 are formed to penetrate the drain-side third insulation layer 44, the interlayer insulation layer 52, the protection insulation layer 51, and the second to fifth inter-wordline insulating layers 31b to 31e (as well as the memory isolation/insulation layer 33), reaching the top surfaces of the first to fourth wordline conductive layers 32a to 32d. Following the step of FIG. 19, Ti, TiN/W are deposited in the plug holes 53, on which CMP process is then performed to form plug conductive layers 54. Then, silicon nitride (SiN) and silicon oxide ($SiO_2$) are deposited thereon to form a first plug insulation layer 55 and a second plug insulation layer 56. Then, first wiring trenches 57a are formed at positions matching the plug conductive layers 54 so as to penetrate the first plug insulation layer 55 and the second plug insulation layer 56. In addition, second wiring trenches 57b are formed at positions matching the drain-side columnar semiconductor layers 47 so as to penetrate in a stripe pattern extending in the column direction. Subsequently, Ti, TiN/W are deposited in the first wiring trenches 57a and the second wiring trenches 57b, on which CMP process is then performed to form first wiring layers 58a and second wiring layers 58b. Through the above-mentioned process, the non-volatile semiconductor storage device 100 is manufactured as illustrated in FIGS. 5 and 6.

In the manufacturing step of FIG. 19, the protection insulation layer 51 serves as a stopper for opening a plurality of plug holes 53 with different depths at the same time.

Advantages of Non-Volatile Semiconductor Storage Device 100 in First Embodiment

Advantages of the non-volatile semiconductor storage device 100 according to the first embodiment will now be described below. As can be seen from the above lamination structure, the non-volatile semiconductor storage device 100 according to the first embodiment may achieve high integration. In addition, as described in the above manufacturing processes of the non-volatile semiconductor storage device 100, each layer corresponding to respective memory transistors MTrmn, source-side selection transistors SSTrmn, and drain-side selection transistors SDTrmn may be manufactured in a predetermined number of lithography steps, irrespective of the number of laminated layers. That is, the non-volatile semiconductor storage device 100 may be manufactured at a lower cost.

Here, consider another method of manufacturing a non-volatile semiconductor storage device, different from the first embodiment of the present invention. For example, in the other manufacturing method, after the step of FIG. 11 in the first embodiment of the present invention, the respective ends of relevant components, such as the first to fourth word-line conductive layers, are processed in a stepwise manner in relation to each other, on which a protection insulation layer and an interlayer insulation layer are formed. Then, CMP process is performed on the respective surfaces of the protection insulation layer and the interlayer insulation layer. Then, a drain-side first insulation layer, a drain-side conductive layer, a drain-side second insulation layer, and a drain-side protection insulation layer (silicon nitride layer) are formed on the top protection insulation layer, by which an interlayer insulation layer is formed. Further, the drain-side first insulation layer, the drain-side conductive layer, the drain-side second insulation layer, and the drain-side protection insulation layer are provided at positions matching the upper portions of the corresponding memory columnar semiconductor layers and formed in a stripe pattern extending in the row direction. Then, CMP process is performed on the respective surfaces of the drain-side protection insulation layer and the interlayer insulation layer. Then, after forming a drain-side third insulation layer, drain-side holes are formed to penetrate the drain-side third insulation layer, the drain-side protection insulation layer, the drain-side second insulation layer, the drain-side conductive layer, the drain-side first insulation layer, and the protection insulation layer.

With the other manufacturing method, however, it is required that the CMP process is repeated at least twice to form the drain-side holes after the source-side selection transistor layer are formed, which would result in cumbersome manufacturing steps. In addition, in the other manufacturing method, the drain-side holes must be formed to penetrate six layers of the drain-side third insulation layer, the drain-side protection insulation layer, the drain-side second insulation layer, the drain-side conductive layer, the drain-side first insulation layer, and the protection insulation layer, which would pose difficulties in processing the holes. Further, in the other manufacturing method, the relevant components, such as the first to fourth word-line conductive layers, have already been formed in a stepwise manner in relation to each other before a step of processing drain-side selection gates, which would pose difficulties in the step of processing drain-side selection gates for these components.

In contrast, in the non-volatile semiconductor storage device 100 according to the first embodiment of the present invention, CMP process is required to be performed only once to form the drain-side holes 45 after the source-side selection transistor layer 20 is formed, which may simplify the manufacturing steps compared to the other manufacturing method. In addition, according to the non-volatile semiconductor storage device 100 according to the first embodiment of the present invention, the drain-side holes 45 need only be formed to penetrate five layers of the drain-side third insulation layer 44, the protection insulation layer 51, the drain-side second insulation layer 43, the drain-side conductive layer 42, and the drain-side first insulation layer 41, which may facilitate formation of the drain-side holes 45 compared to the other manufacturing method. In addition, according to the non-volatile semiconductor storage device 100 according to the first embodiment of the present invention, relevant components, such as the first to fourth wordline conductive layers 32a to 32d, have not been processed in a stepwise manner in relation to each other before a step of processing drain-side selection gates, which may facilitate the step of processing drain-side selection gates compared to the other manufacturing method.

That is, the non-volatile semiconductor storage device 100 according to the first embodiment may provide improvements in the production yields and may be manufactured at a lower cost, due to the simplified manufacturing steps and ease of processing as described above.

Second Embodiment

Specific Configuration of Non-Volatile Semiconductor Storage Device in Second Embodiment Referring now to FIG. 20, a specific configuration of a non-volatile semiconductor storage device according to a second embodiment of the present invention will be described below. Note that the same reference numerals represent the same components as the first embodiment and description thereof will be omitted in the second embodiment.

Figure 20:
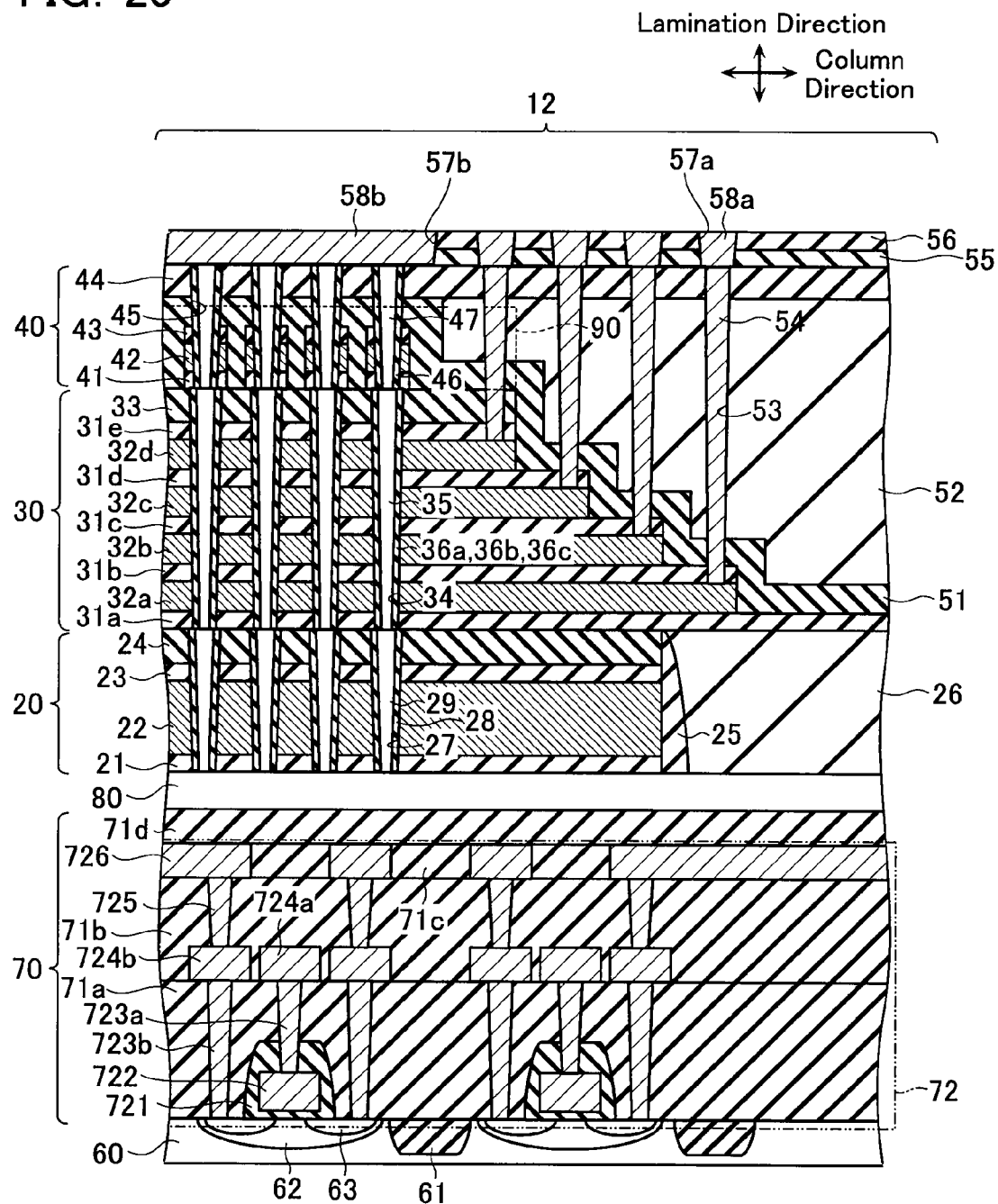
FIG. 20 illustrates a cross-sectional structure in the column direction of a non-volatile semiconductor storage device according to a second embodiment.

As illustrated in FIG. 20, the non-volatile semiconductor storage device according to the second embodiment has a control circuit layer 70 formed on a substrate 60. As in the first embodiment, the non-volatile semiconductor storage device according to the second embodiment has a source-side transistor layer 20, a memory transistor layer 30, and a drain-side transistor layer 40 that are sequentially laminated on the control circuit layer 70 via a source conductive layer 80. In other words, the control circuit layer 70 is provided in the lower layer of the memory strings MS.

The substrate 60 has device isolation/insulation layers 61 at predetermined positions on its surface. In addition, the substrate 60 has well layers 62 that are located between the device isolation/insulation layers 61 on its surface and diffusion layers 63 that are located in the well layers 62. The device isolation/insulation layers 61, the well layers 62, and the diffusion layers 63 are formed immediately below the memory transistor area 12.

The control circuit layer 70 functions as a control circuit for controlling the memory strings MS (the source-side selection transistor layer 20, the memory transistor layer 30, and the drain-side selection transistor layer 40). The control circuit layer 70 has functions of, e.g., the word-line driving circuit 13, the source-side selection gate line driving circuit 14, the drain-side selection gate line driving circuit 15, the sense amplifier 16, etc.

The control circuit layer 70 has interlayer insulation layers 71a to 71d that are sequentially laminated on the substrate 60. The control circuit layer 70 also has a transistor part 72 that functions as a transistor. The transistor part 72 is formed immediately below the memory transistor area 12.

The transistor part 72 has the following layers in the same layer as the interlayer insulation layer 71a: gate insulation layers 721 that are formed across two diffusion layers 63 on the substrate 60; gate conductive layers 722 that are formed on the gate insulation layers 721; and lower first plug conductive layers 723a that are formed on the gate conductive layers 722. The transistor part 72 also has, in the same layer as the interlayer insulation layer 71a, lower second plug conductive layers 723b on the top surfaces of the diffusion layers 63 on the substrate 60. In this case, the top surfaces of the lower first plug conductive layers 723a are formed to the same height as that of the top surfaces of the lower second plug conductive layers 723b.

The transistor part 72 has the following layers in the same layer as an interlayer insulation layer 71b: first lower wiring layers 724a that are formed on the top surfaces of the lower first plug conductive layers 723a; and second lower wiring layers 724b that are formed on the top surfaces of the lower second plug conductive layers 723b. The transistor part 72 also has, in the same layer as the interlayer insulation layer 71b, upper plug conductive layers 725 that are formed on the top surfaces of the second lower wiring layers 724b.

The transistor part 72 has, in the same layer as an interlayer insulation layer 71c, upper wiring layers 726 that are formed on the top surfaces of the upper plug conductive layers 725.

Advantages of Non-Volatile Semiconductor Storage Device in Second Embodiment

As in the first embodiment, the non-volatile semiconductor storage device according to the second embodiment may be manufactured in a predetermined number of lithography steps, irrespective of the number of laminated layers, and may be manufactured at a lower cost. In addition, it may occupy a smaller area due to the control circuit layer 70 provided below the memory strings MS.

Third Embodiment

Specific Configuration of Non-Volatile Semiconductor Storage Device in Third Embodiment Referring now to FIG. 21, a specific configuration of a non-volatile semiconductor storage device according to a third embodiment of the present invention will be described below. Note that the same reference numerals represent the same components as the first and second embodiments and description thereof will be omitted in the third embodiment.

As illustrated in FIG. 21, the non-volatile semiconductor storage device according to the third embodiment has a control circuit layer 70a formed on a substrate 60a. As in the first embodiment, the non-volatile semiconductor storage device according to the third embodiment has a source-side transistor layer 20, a memory transistor layer 30, and a drain-side transistor layer 40 that are sequentially laminated on the control circuit layer 70a via a source conductive layer 80.

Unlike the configuration of the second embodiment, the device isolation/insulation layers 61, the well layers 62, and the diffusion layers 63 are formed immediately below a peripheral area Ph on the substrate 60a that is located at the periphery of the memory transistor area 12.

In addition, unlike the second embodiment, in the control circuit layer 70a, the transistor part 72 is formed immediately below the peripheral area Ph.

Advantages of Non-Volatile Semiconductor Storage Device in Third Embodiment

As in the first embodiment, the non-volatile semiconductor storage device according to the third embodiment may be manufactured in a predetermined number of lithography steps, irrespective of the number of laminated layers, and may be manufactured at a lower cost.

Other Embodiments

While embodiments of the non-volatile semiconductor storage device have been described, the present invention is not intended to be limited to the disclosed embodiments and various other changes, additions, replacements or the like may be made thereto without departing from the spirit of the invention.

What is claimed is:

1. A non-volatile semiconductor storage device comprising a plurality of memory strings with a plurality of electrically rewritable memory cells connected in series,
   each of the memory strings comprising:
       a first columnar semiconductor layer extending in a vertical direction to a substrate;
       a charge trap layer formed to sandwich an insulation layer with the first columnar semiconductor layer and accumulating charges;
       a plurality of first conductive layers formed to sandwich an insulation layer with the charge trap layer and expand in a two-dimensional manner;
       a second columnar semiconductor layer formed in contact with the top surface of the first columnar semiconductor layer and extending in a vertical direction to the substrate; and
       a plurality of second conductive layers formed to sandwich an insulation layer with the second columnar semiconductor layer and formed in a stripe pattern extending in a first direction orthogonal to the vertical direction;
       a protection insulation layer continuously covering over the plurality of first conductive layers and the second conductive layers; and
       an interlayer insulation layer formed on the protection insulation layer,
   respective ends of the plurality of first conductive layers in the first direction being formed in a stepwise manner in relation to each other,
   entirety of the plurality of the second conductive layers being formed in an area immediately above the top layer of the first conductive layers, and
   an etching rate of the protection insulation layer being different from an etching rate of the interlayer insulation layer.

2. The non-volatile semiconductor storage device according to claim 1, wherein
   the protection insulation layer is formed with the same thickness on the plurality of first conductive layers and on the second conductive layers.

3. The non-volatile semiconductor storage device according to claim 1, wherein
the protection insulation layer is composed of silicon nitride.

4. The non-volatile semiconductor storage device according to claim 1, further comprising:
   a control circuit layer provided in the lower layer of the memory strings and controlling the memory strings.

5. The non-volatile semiconductor storage device according to claim 4, wherein
   the control circuit layer has a transistor part functioning as a transistor, and
   the transistor part is formed in an area immediately below the memory strings.

6. The non-volatile semiconductor storage device according to claim 4, wherein
   the control circuit layer has a transistor part functioning as a transistor, and
   the transistor part is formed in an area immediately below a peripheral area of the memory strings.

7. The non-volatile semiconductor storage device according to claim 1, wherein
   each of the memory strings further comprises:
       a third columnar semiconductor layer formed in contact with the bottom surface of the first columnar semiconductor layer and extending in a vertical direction to the substrate; and
       a third conductive layer formed to sandwich an insulation layer with the third columnar semiconductor layer and expanding in a direction orthogonal to the vertical direction.

8. The non-volatile semiconductor storage device according to claim 1, further comprising
   wirings electrically connected to the memory strings,
   wherein each of the wirings comprises:
       a plurality of fourth conductive layers extending in the vertical direction so as to penetrate the protection insulation layer, and
       wherein the bottom surfaces of the fourth conductive layers are formed in contact with the top surfaces of the plurality of first conductive layers formed in the stepwise manner in relation to each other, or the top surfaces of the second conductive layers.

9. The non-volatile semiconductor storage device according to claim 1, wherein
   the first conductive layers and the second conductive layers are composed of polysilicon,
   the first columnar semiconductor layers and the second columnar semiconductor layers are composed of polysilicon, and
   the charge trap layers are composed of silicon nitride.

10. The non-volatile semiconductor storage device according to claim 7, wherein
    the third conductive layers are composed of polysilicon, and
    the third columnar semiconductor layers are composed of polysilicon.

11. The non-volatile semiconductor storage device according to claim 8, wherein
    the fourth conductive layers include a lamination structure of titanium, or titanium nitride, and tungsten.

12. A method of manufacturing a non-volatile semiconductor storage device having a plurality of memory strings with a plurality of electrically rewritable memory cells connected in series, the method comprising:
    alternately laminating a plurality of first interlayer insulation layers and a plurality of first conductive layers;
    forming a first hole so as to penetrate the first interlayer insulation layers and the first conductive layers;

forming a first columnar semiconductor layer in the first hole via a charge trap layer;
alternately laminating second interlayer insulation layers and second conductive layers on the first interlayer insulation layers;
forming the second interlayer insulation layers and the second conductive layers in a stripe pattern extending in a first direction orthogonal to a lamination direction;
forming respective ends of the first interlayer insulation layers and respective ends of the first conductive layers in a stepwise manner in relation to each other; and
covering the first interlayer insulation layers, the first conductive layers, the second interlayer insulation layers, and the second conductive layers with a protection insulation layer,
in forming the respective ends in a stepwise manner, the second interlayer insulation layers and the second conductive layers are formed in such a way that the entire second interlayer insulation layers and the entire second conductive layers are formed in an area immediately above the top layer of the first conductive layers.

13. The method of manufacturing the non-volatile semiconductor storage device according to claim 12, wherein
the protection insulation layer is formed with the same thickness either on the plurality of first conductive layers and on the second conductive layers.

14. The non-volatile semiconductor storage device according to claim 12, wherein
the protection insulation layer is composed of silicon nitride.

15. The method of manufacturing the non-volatile semiconductor storage device according to claim 12, the method further comprising:
forming a second hole so as to penetrate the second interlayer insulation layers and the second conductive layers; and
forming a second columnar semiconductor layer in the second hole via a first insulation layer.

16. The method of manufacturing the non-volatile semiconductor storage device according to claim 12, the method comprising:
prior to laminating the first interlayer insulation layers and the first conductive layers,
alternately laminating third interlayer insulation layers and third conductive layers;
forming a third hole so as to penetrate the third interlayer insulation layers and the third conductive layers; and
forming a third columnar semiconductor layer in the third hole via a second insulation layer.

17. The method of manufacturing the non-volatile semiconductor storage device according to claim 12, the method comprising:
forming a fourth interlayer insulation layer to a predetermined height such that the protection insulation layer is filled up with the fourth interlayer insulation layer;
forming a fourth hole so as to penetrate the fourth interlayer insulation layer and the protection insulation layer and to reach the first conductive layers and the second conductive layers; and
forming a fourth conductive layer so as to fill up the fourth hole.

18. The method of manufacturing the non-volatile semiconductor storage device according to claim 12, wherein
the first conductive layers and the second conductive layers are composed of polysilicon,
the first columnar semiconductor layer and the second columnar semiconductor layer are composed of polysilicon, and
the charge trap layer is composed of silicon nitride.

19. The method of manufacturing the non-volatile semiconductor storage device according to claim 16, wherein
the third conductive layers are composed of polysilicon, and
the third columnar semiconductor layer is composed of polysilicon.

20. The method of manufacturing the non-volatile semiconductor storage device according to claim 17, wherein
the fourth conductive layer includes a lamination structure of titanium, or titanium nitride, and tungsten.

* * * * *